(12) United States Patent
Ferrão De Paiva Martins et al.

(10) Patent No.: US 11,360,044 B2
(45) Date of Patent: Jun. 14, 2022

(54) SENSITIVE FIELD EFFECT DEVICE AND MANUFACTURING METHOD THEREOF

(71) Applicants: ALMA MATER STUDIORUM—UNIVERSITA' DI BOLOGNA, Bologna (IT); UNIVERSIDADE NOVA DE LISBOA, Lisbon (PT)

(72) Inventors: Rodrigo Ferrão De Paiva Martins, Charneca da Caparica (PT); Pedro Miguel Cândido Barquinha, Moscavide (PT); Elvira Maria Correia Fortunato, Charneca da Caparica (PT); Tobias Cramer, Pianoro (IT); Beatrice Fraboni, Bologna (IT)

(73) Assignees: Universidade Nova de Lisboa, Lisbon (PT); Alma Mater Studiorum—Universita di' Bologna, Bologna (IT)

( * ) Notice: Subject to any disclaimer, the term of this patent is extended or adjusted under 35 U.S.C. 154(b) by 0 days.

(21) Appl. No.: 16/349,830

(22) PCT Filed: Mar. 14, 2017

(86) PCT No.: PCT/IT2017/000050
§ 371 (c)(1),
(2) Date: May 14, 2019

(87) PCT Pub. No.: WO2018/087787
PCT Pub. Date: May 17, 2018

(65) Prior Publication Data
US 2019/0277798 A1  Sep. 12, 2019

(30) Foreign Application Priority Data
Nov. 14, 2016  (PT) .......................... 20161000082412

(51) Int. Cl.
*G01N 27/414* (2006.01)
*G01T 1/24* (2006.01)
(Continued)

(52) U.S. Cl.
CPC ............. *G01N 27/414* (2013.01); *G01T 1/24* (2013.01); *G01T 1/366* (2013.01);
(Continued)

(58) Field of Classification Search
CPC ......... H01L 29/78603; H01L 29/66969; H01L 29/78693; G01N 27/414; G01T 1/24; G01T 1/366
(Continued)

(56) References Cited

U.S. PATENT DOCUMENTS 6,002,963 A * 12/1999 Mouchawar ....... A61N 1/36542
607/18
2006/0154424 A1 * 7/2006 Yang ................. H01L 27/11568
438/283
(Continued)

FOREIGN PATENT DOCUMENTS

CN   105 870 173 A   8/2016
JP   2006-165530      6/2006
(Continued)

OTHER PUBLICATIONS

International Search Report dated Jul. 14, 2017 for International Application No. PCT/IT2017/000050, in 4 pages.
(Continued)

*Primary Examiner* — Thao X Le
*Assistant Examiner* — Gardner W. S. Swan
(74) *Attorney, Agent, or Firm* — Knobbe, Martens, Olson & Bear, LLP (57) ABSTRACT

The present invention concerns a sensitive field effect device (100) comprising a semiconductor channel (110), a source
(Continued)

electrode (120) connected to said semiconductor channel (110), a drain electrode (130) connected to said semiconductor channel (110), such that said semiconductor channel (110) is interposed between said source electrode (120) and said drain electrode (130), a gate electrode (140) and a dielectric layer (150) interposed between said gate electrode (140) and said semiconductor channel (110), characterized in that said semiconductor channel (110) is a layer and is made of an amorphous oxide and in that said sensor means (170, 171, 172, 173, 174, 175, 175) are configured to change the voltage between said gate electrode (140) and said source electrode (120) upon a sensing event capable of changing their electrical state.

The present invention also concerns a sensor and a method for manufacturing said field effect device (100).

16 Claims, 11 Drawing Sheets (51) Int. Cl.
*G01T 1/36* (2006.01)
*H01L 29/66* (2006.01)
*H01L 29/786* (2006.01)

(52) U.S. Cl.
CPC .. *H01L 29/66969* (2013.01); *H01L 29/78603* (2013.01); *H01L 29/78693* (2013.01)

(58) Field of Classification Search
USPC .......................................................... 257/253
See application file for complete search history.

(56) References Cited

U.S. PATENT DOCUMENTS

| | | | | |
|---|---|---|---|---|
| 2010/0123654 | A1* | 5/2010 | Kimura | G02F 1/133528 345/92 |
| 2012/0223925 | A1* | 9/2012 | Yamamoto | G01J 1/46 345/207 |
| 2014/0056028 | A1* | 2/2014 | Nichol | G02B 6/0075 362/611 |
| 2015/0330941 | A1 | 11/2015 | Smith et al. | |
| 2018/0166482 | A1* | 6/2018 | Park | H01L 29/7833 |
| 2018/0210337 | A1* | 7/2018 | Wakita | G06K 19/077 |
| 2018/0356291 | A1* | 12/2018 | Mainguet | G01J 5/34 |

FOREIGN PATENT DOCUMENTS

| | | |
|---|---|---|
| JP | 2009-094465 | 4/2009 |
| JP | 2012-119531 | 6/2012 |
| JP | 2013-076656 | 4/2013 |
| JP | 2015-043064 | 3/2015 |
| JP | 2016-015485 | 1/2016 |
| JP | 2016-025572 | 2/2016 |

OTHER PUBLICATIONS

Written Opinion of the International Searching Authority dated Jul. 14, 2017 for International Application No. PCT/IT2017/000050, 6 pages.

Cramer, et al., "Radiation-Tolerant Flexible Large-Area Electronics Based on Oxide Semiconductors", Advanced Electronics Materials, vol. 2, No. 7, May 19, 2016, p. 1500489, XP055387696.

Zhao, et al., "Amorphous In—Ga—Zn—O thin-film transistor active pixel sensor x-ray imager for digital breast t", Medical Physics, AIP, Melville, NY, US, vol. 41, No. 9, Aug. 12, 2014, XP012188657.

Lujan, et al., "Flexible X-Ray Detector Array Fabricated with Oxide Thin-Film Transistors", IEEE Electron Device Letters, IEEE Service Center, New York, NY, US, vol. 33, No. 5, May 1, 2012., pp. 688-690, XP011441964.

Tsai, et al., Comprehensive Nuclear Material Surveillance with a Radiation Detector-Equipped ARG-US RFID System Introduction, JW Marriott Desert Springs, Jul. 18, 2013, XP055387948.

* cited by examiner

SENSITIVE FIELD EFFECT DEVICE AND MANUFACTURING METHOD THEREOF

CROSS-REFERENCE TO RELATED APPLICATIONS

This application is a U.S. national phase of International Application No. PCT/IT2017/000050 filed on Mar. 14, 2017, which claims priority to Portugese Patent Applicaton No. 20161000082412 filed on Nov. 14, 2016, each of which is incorporated by reference it its entirety.

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

INCORPORATION-BY-REFERENCE OF MATERIAL SUBMITTED ON A COMPACT DISC OR AS A TEXT FILE VIA THE OFFICE ELECTRONIC FILING SYSTEM

Not applicable

STATEMENT REGARDING PRIOR DISCLOSURES BY THE INVENTOR OR A JOINT INVENTOR

Not applicable

BACKGROUND

The present invention relates to a sensitive field effect device and manufacturing method thereof.

SUMMARY

More specifically, the invention concerns a field effect transistor, designed to feature a low leakage current as well as a high bandwidth, so as to be highly sensitive, if compared with analogous sensors according to the prior art. It is also particularly indicated for detecting circuits and designed to detect several kind of physical quantities, such as temperature, mechanical stresses, light, chemicals, ionizing radiation, such as X-rays and the like, and also suitable to be arranged in flexible substrates arrays or matrix.

In the following, the description will be directed to the field affect devices adapted to sense several kind of physical phenomena, better discussed below, but it is clear that the same should not be considered limited to these specific uses.

As it is well known, currently high sensibility sensors are requested by industry and scientific search, in order to detect different physical phenomena.

By way of example, the demand is increasing for the diffusion of a RF/Os receivers, to be connected to specific chips probes, generally made of transistors, usually realized in CMOS technology.

It is also known that low-cost RFID chips exhibit an auxiliary terminal for sensor connections. A RFID chip probes impedance of the connected sensor at high bandwidth (of the order of 100 kHz). An impedance Z greater of 20 MΩ results in the state 0, instead a value of said impedance Z below 2 MΩ results in the state 1.

A technical problem currently felt in the field is that of creating sensors that (i) operate at the high bandwidth of RFID, (ii) show an order of magnitude variation in impedance response in a given range triggered by the sensing event, (iii) maintain the impedance variation also after the occurrence of the sensing event and (iv) are compliant to low cost-mass production technology.

Nowadays, RF/0 chips are based on CMOS technology. Such technology however introduces some limits to accomplish the above objectives, due to current leakage phenomena. Such leakage phenomena increase power consumption of the single field effect transistor considerably.

In order to deepen the necessity of devices capable of overcoming the technical drawbacks of the available prior art devices, more remarks on specific technical problems of radiation detection and dosimetry are outlined below.

It is in fact well known that currently radiation detection and dosimetry is of relevance in medical imaging and radiotherapy, protection of personnel working in potentially contaminated areas such as nuclear reactors, nuclear waste deposits, and luggage security screening and dosimetry in radiation harsh environments, such as space.

In many cases, a wearable detector is needed, which combines low-voltage and low-power operation with high sensitivity, low-weight and flexible mechanical properties.

Existing dosimeters for ionizing radiation can be distinguished in two different main classes, both showing specific drawbacks.

A first type of dosimeters is based on thermoluminescent phosphate glasses or gafchromic film and can actually achieve a high sensitivity. However, as a drawback, these dosimeters do not allow real-time detection of the radiation, but require readout in a dedicated instrument after exposure by optical techniques.

A second type of dosimeters employs silicon complementary metal oxide semiconductor electronics and provides direct electronic readout, thus providing real-time data about radiation exposure. Drawbacks of this technical approach are reduced sensitivities due to the absorption of only a fraction of exposed ionizing particles, mechanical rigidity of the sensors and the impossibility to process devices on large areas of flexible substrates. In addition, as a further drawback, these devices are not mechanically flexible, and therefore of limited use for wearable dosimeters.

In view of the above, it is an object of the present invention to overcome the drawbacks of the prior art devices, in order to achieve a high sensitivity general purpose device, suitable to detect a variety of physical phenomena.

It is further object of the invention providing a device that features a high sensibility for detecting ionization radiations, such as X-rays and the like.

It is also object of the invention providing a flexible device featuring real-time electronic readout of radiation exposure.

It is another object of the invention to provide a device architecture capable of increasing the amount of X-ray photon absorption and then the sensitivity.

Therefore, an aspect of the present invention is a high sensitive and high bandwidth field effect transistor that allows to detect even small changes of physical phenomena.

Also, an aspect of the present invention is a flexible ionization sensitive field effect transistor (FISFET) that allows to detect and monitor ionizing radiation (e.g. X-rays, gamma, neutrons alpha, beta rays).

Thus, an aspect of the present invention is a sensitive field effect device comprising a semiconductor channel, a source electrode connected to said semiconductor channel, a drain electrode connected to said semiconductor channel, such that said semiconductor channel is interposed between said source electrode and said drain electrode, a gate electrode and a dielectric layer interposed between said gate electrode and said semiconductor channel, characterized in that said semiconductor channel is a layer and is made of an amorphous oxide and in that said sensor means are configured to change the voltage between said gate electrode and said source electrode upon a sensing event capable of changing their electrical state.

Always according to the invention, said amorphous oxide could be high mobility amorphous oxide type and it is selected from the group comprising: Indium Gallium Zinc Oxide (IGZO) and/or Indium Hafnium Zinc Oxide (IHZO) and/or Zinc Tin Oxide (ZTO) and/or Gallium Zinc Tin Oxide (GZTO).

Still according to the invention, said sensing means comprise a capacitor connected to said gate electrode and said source electrode.

Further according to the invention, said sensing means could comprise a dielectric layer arranged in order to be exposable to an ionizing radiation, such as X-rays and the like, comprising in its turn at least one main layer, made of at least one material having at least one cation element with atomic number selected so as to increase the absorption of said incident ionizing radiation to be sensed.

Preferably according to the invention, said at least one material of said dielectric layer could have a high atomic number Z, said atomic number Z being higher than 36 (Z>36).

Always according to the invention, said at least one main layer of said dielectric layer could be made of Yttrium Oxide (Y2O3) and/or Zirconium Oxide ($ZrO_2$) and/or Hafnium Oxide (HfO2) and/or Tantalum Pentoxide (Ta2O5) and/or Bismuth Oxide ($Bi_2O_3$).

Still according to the invention, said sensing means could comprise a photodiode, for detecting an electromagnetic radiation, connected to said gate electrode and said source electrode.

Further according to the invention, said sensing means could comprise a rectifier diode, series connected with a piezoelectric sensor, said sensing means being parallel connected to said gate electrode and said source electrode.

Advantageously according to the invention, said sensing means could comprise a pyroelectric sensor, capable of sensing the environment temperature, said pyroelectric sensor being connected to said gate electrode and said source electrode.

Preferably according to the invention, said sensing means could comprise a chemical sensor connected to said gate electrode and said source electrode.

Always according to the invention, said dielectric layer could be in electrical contact with said source electrode and said drain electrode.

Still according to the invention, said dielectric layer has a thickness greater than or equal 150 nm.

Further according to the invention, said dielectric layer could be a multilayer, comprising one or more insulating layers with an atomic number lower than atomic number of said main layer.

Advantageously according to the invention, said one or more insulating layers of said dielectric layer could be made of silicon-dioxide ($SiO_2$) and/or aluminum-oxide ($Al_2O_3$).

Preferably according to the invention, said dielectric layer could comprise the combination of said insulating layer, with lower atomic number atoms, and said main layer repeated from two to ten times, and a top layer of the said insulating layer with lower atomic number atoms.

Always according to the invention, said device could comprise at least one substrate, on which said gate electrode and said dielectric layer are deposited.

Still according to the invention, said at least one substrate could be flexible.

Advantageously according to the invention, said at least one substrate could be made of Polyethylene Naphthalate.

Further according to the invention, said gate, source and drain electrodes could be made of conductive materials, such as molybdenum (Mo), copper (Cu), aluminum (Al), gold (Au) and/or silver (Ag), and/or conducting oxides, such as Gallium-doped Zinc Oxide (GZO) or Indium Zinc Oxide (IZO) and/or conducting polymers such as Pedot: Pss.

It is further object of the present invention a detecting sensor, comprising a substrate and a plurality of sensitive field effect devices, as described above, arranged on said substrate, said ionization sensitive field effect devices being connected with at least another sensitive field effect device.

Always according to the invention, said substrate could be flexible and it could be preferably made of Polyethylene Naphthalate.

Still according to the invention, said field effect devices could be arranged as an array or as a matrix.

Further according to the invention, said sensor could comprise at least one RFID transmitter having a pair of electrodes connected to the source electrode and the gate electrode of a related field effect device, configured for being connectable to a RFID receiver.

Advantageously said RFID transmitter could comprise an RFID chip and an antenna.

Preferably according to the invention, said sensor could comprise a plurality of RFID transmitter, each one being operatively connected to a related field effect devices.

It is also object of the present invention a method for manufacturing a field effect device described above, characterized in that it comprises the following steps: (A) depositing said gate electrode on said flexible substrate and carrying out a photolithography and etching process or lift-off on said gate electrode; (B) depositing said dielectric layer and carrying out a photolithography and etching process or lift-off on said dielectric layer; (C) depositing said semiconductor channel and carrying out a photolithography and etching process or lift-off on said semiconductor channel; (D) carrying out a photolithography process on said semiconductor channel and depositing said source electrode and said drain electrode; and (E) patterning said source electrode and said drain electrode by lift-off.

Always according to the invention said step (B) could be carried out by RF-sputtering, performed in parallel from two separate targets containing said insulating material of said insulating layer and said material of said main layer of said dielectric, and/or via solution-based processes containing said material of said insulating layer and said material of said main layer of said dielectric, so as to create the multilayer structure of said dielectric layer, by alternating depositions of an insulating layer only, such as silicon-dioxide ($SiO_2$) and/or aluminum-oxide ($Al_2O_3$), and co-depositions of an insulating material, such as silicon-dioxide ($SiO_2$) and/or aluminum-oxide ($Al_2O_3$), and said material of said main layer of said dielectric.

BRIEF DESCRIPTION OF THE SEVERAL VIEWS OF THE DRAWINGS

The present invention will now be described, for illustrative but not limitative purposes, according to its preferred embodiments, with particular reference to the figures of the enclosed drawings, wherein.

In the various figures, similar parts will be indicated by the same reference numbers.

DETAILED DESCRIPTION

Figure 1:
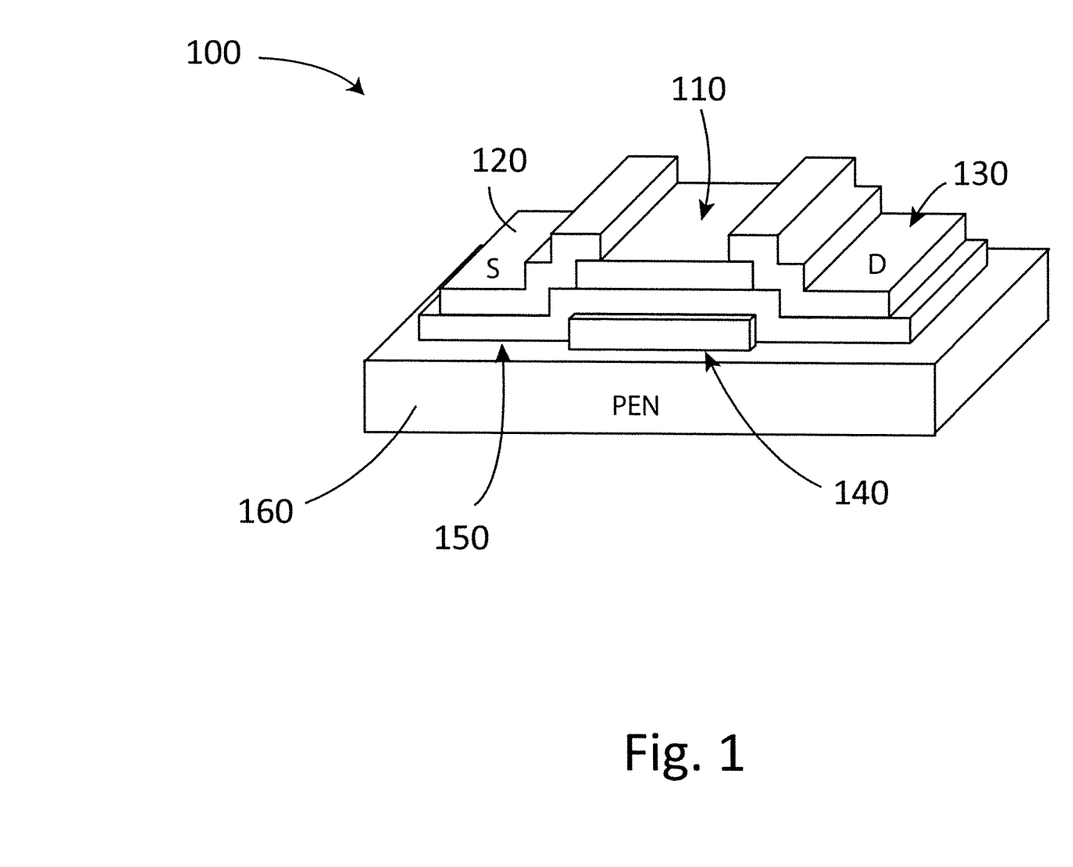
FIG. 1 shows a perspective scheme of the architecture of a single ionization sensitive field effect device according to the present invention.

Referring to FIG. 1, a first embodiment of a field effect device 100 according to the invention is shown, wherein details of the device architecture are also specified, for detecting electromagnetic radiations and particularly ionizing radiations, such as X-rays and the like.

The device 100 mainly comprises source, drain and gate electrodes, indicated with reference numbers 120, 130 and 140 respectively, a semiconductor channel layer 110, arranged on a dielectric layer 150, and a substrate 160.

Said source electrode 120, said drain electrode 130 and said gate electrode 140 are made of a conductive material, such as molybdenum (Mo), copper (Cu), aluminum (Al), gold (Au) or silver (Ag), or even conducting oxides, such as Gallium Zinc Oxide, Indium Zinc Oxide.

Said dielectric layer 150 has a thickness greater than 150 nm, so as to prevent the tunneling effects and the relevant leakage currents. This allows also reducing the overall leakage current effects possibly due to other phenomena.

The semiconductor channel layer 110 is arranged between, and in electric contact with said source electrode 120 and said drain electrode 130. Said semiconductor channel layer 110 is made of a high mobility amorphous oxide. In particular, said semiconductor channel layer 110 can be made of Indium Gallium Zinc Oxide (IGZO), Indium Hafnium Zinc Oxide (IHZO), Zinc Tin Oxide (ZTO) or Gallium Zinc Tin Oxide (GZTO).

Figure 2:
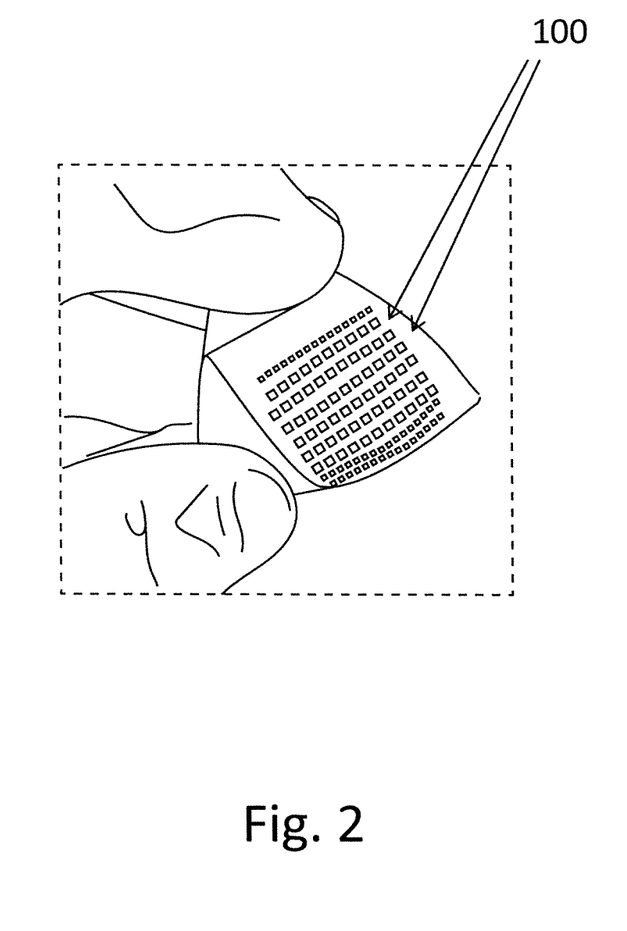
FIG. 2 shows arrays of ionization sensitive field effect device according to FIG. 1 arranged on a flexible substrate.

The high mobility amorphous oxides used for said semiconductor channel layer 110 are fabricated by photolithography. They feature high bandwidth, low parasitic capacitance and minimal gate current, as it can be appreciated from FIG. 2 and are thus compliant to low-voltage operation, particularly with RFID circuits.

Said field effect device 100 comprises also sensor means, so that, upon sensing and event to be detected, the impedance, commonly referred to with the letter Z, of the semiconductor channel layer 110 is varied by over an order of magnitude, thus allowing, for example, the connection of a RFID transmitter, as better explained below.

In the present embodiment, in addition to the above, the semiconductor channel layer 110 is exposed to the radiation to be detected.

The sensing means provided in the field effect device 100 according to the present embodiment comprises multilayer dielectric oxide structure dielectric layer 150, comprising a main layer, combined with one or more further layers with lower atomic number atoms.

Said main layer is a high-Z layer, this meaning that the atomic number is higher than 36. In particular, said main layer is made of at least one of the following materials:

Yttrium Oxide ($Y_2O_3$);
Zirconium Oxide ($ZrO_2$);
Hafnium Oxide ($HfO_2$);
Tantalum Pentoxide ($Ta_2O_5$);
Bismuth Oxide ($Bi_2O_3$).

Said one or more further layers with lower atomic number atoms is an insulating layer that can be for example $SiO_2$ or $Al_2O_3$.

The bottom layer of the multicomponent dielectric is said insulating layer with lower atomic number atoms, followed by the main layer. This structure is then repeated two to ten times, followed by a top layer of the said insulating layer with lower atomic number atoms.

The dielectric layer 150 is deposited on said flexible substrates 160 such as Polyethylene Naphthalate, to achieve flexible sensitive field effect device 100. More specifically, in FIG. 2, arrays patterned on polymeric/plastic substrates are shown, comprising a plurality of ionization sensitive field effect devices 100.

In addition to the above, it is seen that the gate electrode 140 is arranged between said flexible substrates 160 and said dielectric layer 150.

The operation of the device 100, based on the accumulation of ionization charges in the multilayer dielectric oxide structure 150 due to X-ray radiation as described above is as follows.

Figures 3, 3A, 3B, 3C:
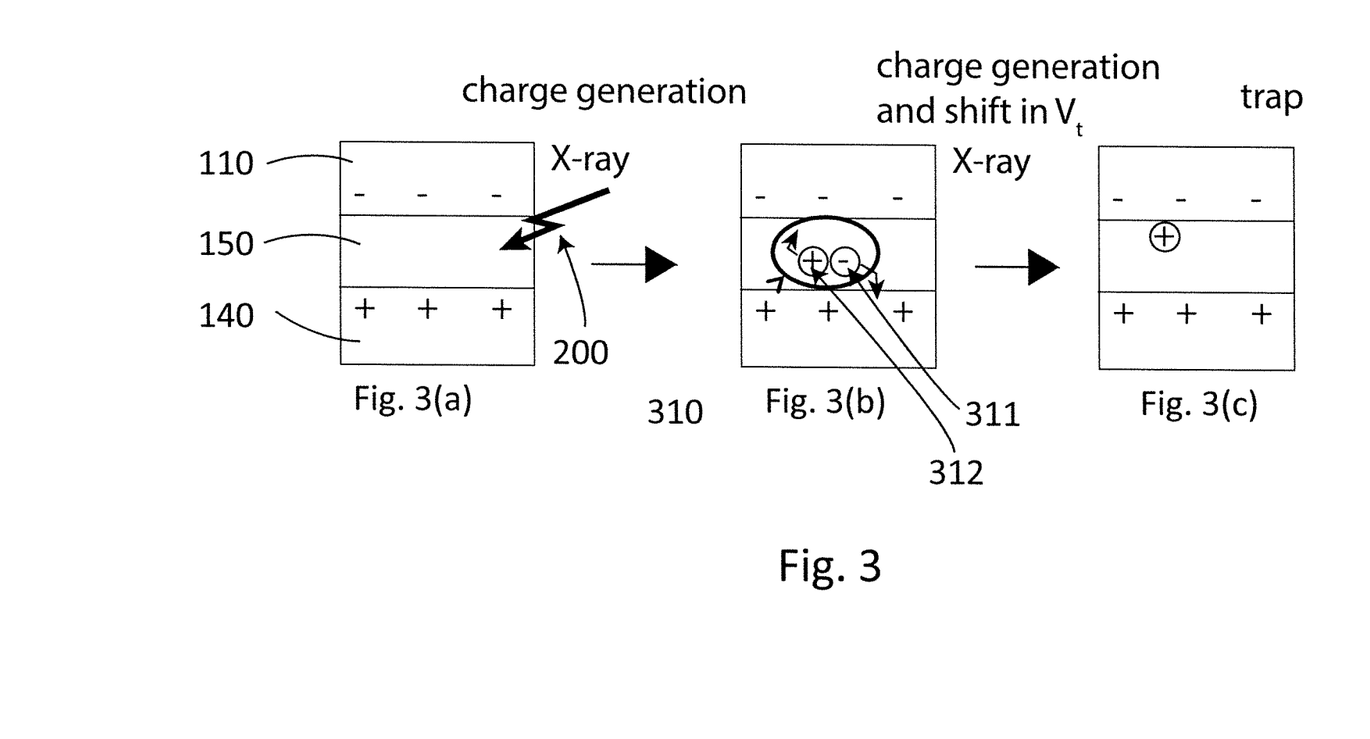
FIGS. 3a, 3b and 3c show a simplified model for explaining the ionization damage effect and the related carrier accumulation in the ionization sensitive field effect device of FIG. 2.

In FIGS. 3a-3c, basic processes how the device operates are schematically depicted.

The formation of ionization charge is initiated by the absorption of a high-energy photon or photoelectron 200 (see FIG. 3a), giving the generation of an electron hole pair 310 in the dielectric layer 150.

The electrons 311 (see FIG. 3b) are collected in a fast process, namely faster than respective holes collection process, at the gate electrode 140.

The remaining hole charges 312 move, as said, slowly in a thermally activated hopping process to the interface with the semiconductor channel 110 (see FIG. 3c).

Thus, as a consequence of X-ray exposure, a larger drain current and a shift in threshold voltage to negative values result.

Figure 4:
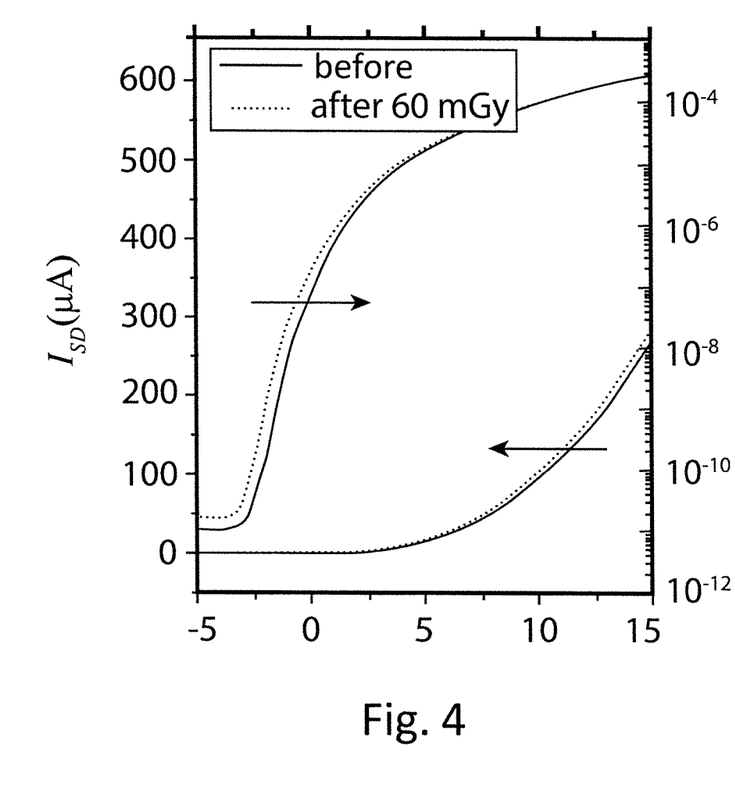
FIG. 4 shows a plot with transfer characteristics before and after exposure of X-ray radiation.

FIG. 4 shows as an example ionization sensitive field effect device 100 transfer curves, measured in saturation (drain electrode 130 voltage VD=20 Volts) before and after exposure to a total dose of 60 mGy (in the air; Gy is Gray unit measure) emitted by a molybdenum (Mo)-tube as a X-ray source, operated at a dose rate of 60 mGy/s.

The transfer characteristics show a shift of 0,326 V to more negative gate potentials, after X-ray exposure (reference to FIG. 3a state). No other transistor parameter, such as sub-threshold slope or mobility is influenced by the exposure.

The shift is a consequence of the positive carriers accumulation at the interfaces between the dielectric layer 150 and the semiconductor channel 110 (see FIG. 3c). Positive carriers accumulation influences the voltage between said source electrodes 120 and said gate electrode 130 at fixed current flux. By measuring the variation of the gate potentials, it is possible to infer the amount of X-ray dose to which the device 100 has been exposed to.

Sensitivity of the device 100 to ionization depends crucially on the composition and thickness of the high-Z dielectric multilayer 150.

Figure 5A:
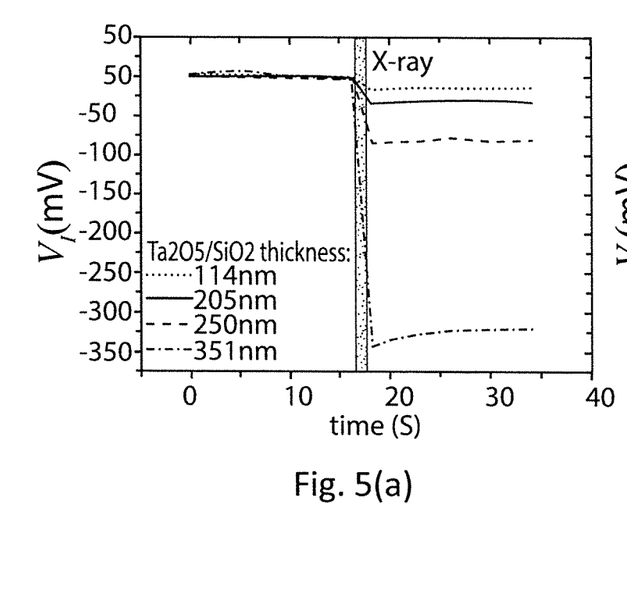
FIGS. 5a and 5b shows plots of ionization sensitive field effect device threshold voltage Vt before and after exposure for 1 second to X-ray.

Low X-ray attenuation length ($\lambda < 60$ μm) in this layer is achieved due to the high atomic number (e.g. using Tantalum Oxide), whereas an oxide layer (e.g. $SiO_2$) serves to maintain good isolating and interfacial properties. Increasing the thickness of multilayer dielectric oxide structure 150 allows to further improve the X-ray response, as demonstrated in FIG. 5a. This figure shows how, by increasing the thickness of the dielectric layer 150 from 114 nm to 381 nm, the threshold shift increases by a factor of 6 as well.

Furthermore the ionization sensitive field effect device 100 according to the invention, allows to perform quantitative dosimetry by monitoring variations in threshold, as it offers a linear dependency between exposure dose and threshold shift for total doses remaining below 100 mGy.

Figure 5B:
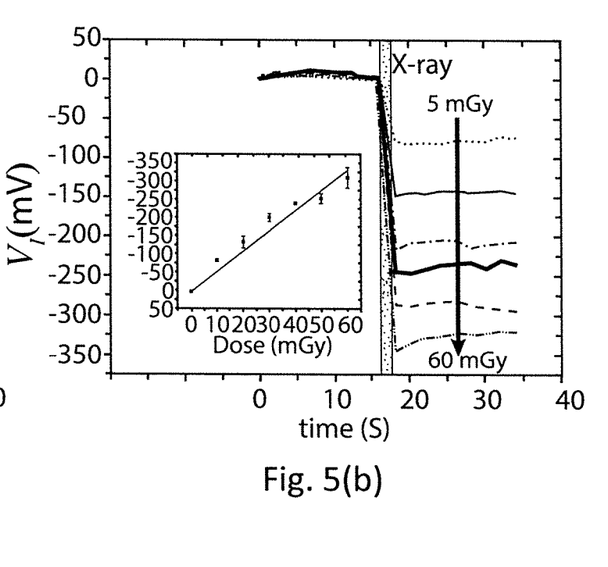

This finding is shown in FIG. 5b, which shows the variation of threshold voltage caused by exposure to X-ray 200 of varying dose-rates for a period of 1 sec. The inset shows the resulting shift in threshold voltage as a function of dose. The linear fit results in a sensitivity of 5.5 mV/mGy.

The device 100 operates as an integrating dosimeter and maintains the threshold voltage after the X-ray exposure event.

Figure 6A:
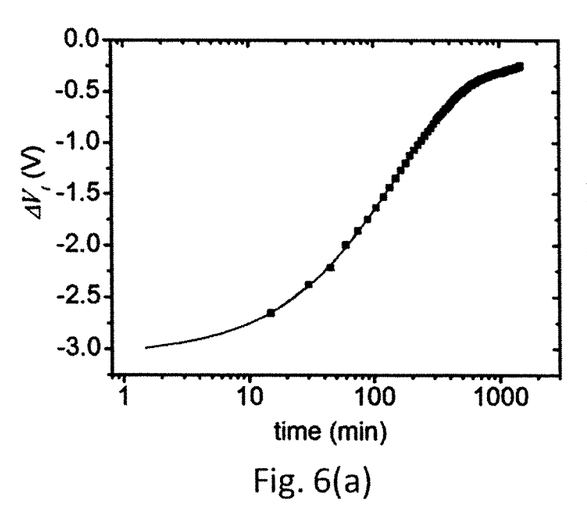
FIGS. 6a and 6b shows the dynamics of the ionization sensitive field effect device threshold voltage recovery after X-ray exposure.
Figure 6B:
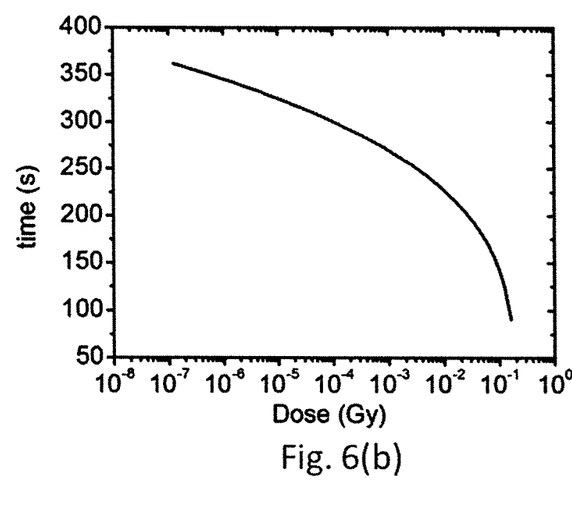

FIGS. 6a and 6b displays a recovery measurement, in which the threshold voltage was monitored for 22 hours after an exposure to a dose of 21 Gy. The curve follows a stretched exponential with a characteristic time-scale of a few hours.

From these data, it is possible to calculate the time in which readout of the device 100 has to be carried out, to keep the error due to recovery drift below 10%. Due to the stretched exponential behavior, this time interval depends on the detected dose with longer retention times being observed at lower doses. From these data, defining a maximum readout time, which is plotted in FIG. 6b as a function of the radiation dose, is possible.

The maximum readout time interval is defined here as the time after an X-ray exposure event in which the drift in threshold voltage remains below 10%.

In the range where the device 100 shows a linear response, the maximum readout time exceeds 300 sec. This long retention time makes even the sequential readout of a large detector array feasible.

The manufacturing of an ionization sensitive field effect device 100 comprises the following main steps.

The gate electrode 140 is deposited on the flexible substrates 160 using materials processing via physics routes such as sputtering or chemical routes, such as solution based processes, such as screen printing, sol gel, among others. Patterning of gate electrodes 140 is performed with photolithography and etching processes or lift-off.

The dielectric layer 150 can be deposited using different techniques such as RF-sputtering, from two separate targets containing $SiO_2$ and $Ta_2O_5$ or via solution-based processes, containing the elements above mentioned. Both processes can be run in parallel. For the sputtering case, a mechanical shutter was used, so as to create the multilayer structure of the dielectric layer 150, by alternating depositions of $SiO_2$ only and co-depositions of $SiO_2$ and $Ta_2O_5$. For solution route method, the thickness was determined by the number of deep steps (e.g. sol gel deep coating), or by the amount of material spread over the surface (e.g. screen printing). Patterning of dielectric layer 150 is performed with photolithography and etching processes or lift-off.

The subsequent step is to deposit a high mobility amorphous oxide semiconductor channel 110 on the dielectric layer 150, using materials processing via physics routes, such as sputtering or chemical routes, such as solution based processes (e.g. screen printing, sol gel, among others). Patterning of oxide semiconductor channel 110 is performed with photolithography and etching processes or lift-off.

Finally, said source electrode 120 and said drain electrode 130 are deposited using materials processing via physics routes such as sputtering or chemical routes, such as solution based processes, such as screen printing, sol gel, and the like, after a photolithography process. Said source electrode 120 and said drain electrode 130 are patterned using lift-off.

Field effect device 100 can be also connected to a RFID transmitter. In particular, referring to FIG. 7, general electrical connection of the field effect device 100 according to the invention is seen, with an RFID transmitter 400, properly integrated together with said device 100.

Figure 7:
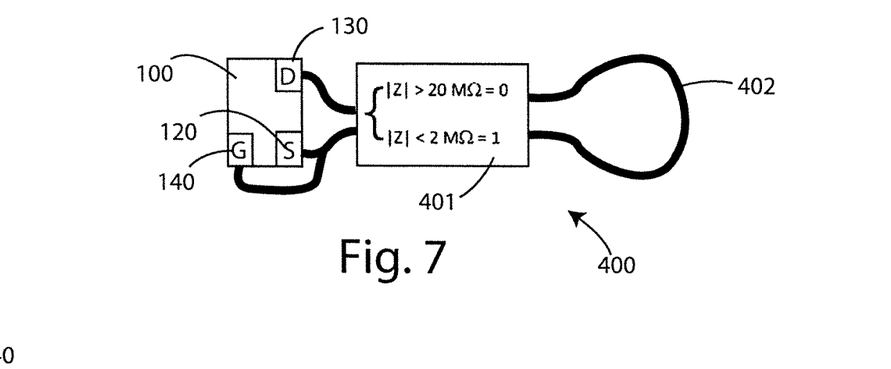
FIG. 7 shows a general electrical connection of the field effect device according to the invention with an RFID transmitter.

Said RFID transmitter 400 comprises a RFID chip 401, connected to the source electrode 120 and the drain electrode 130, namely it is parallel connected to the semiconductor channel layer 110, and an antenna 402 is in its turn connected to said RFID chip 400. In the figure, typical levels of impedance Z determining the logic states are also shown.

Figure 8:
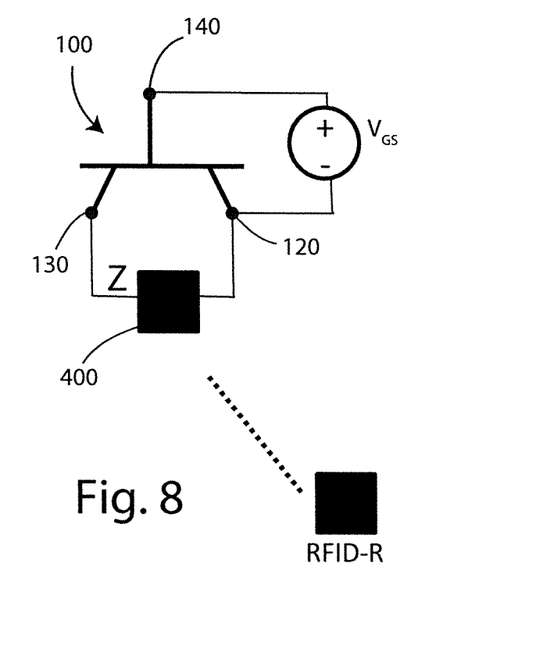
FIG. 8 shows a schematic diagram of the electrical connection of the field effect device according to the invention with an RFID transmitter.

In addition, FIG. 8 shows the connection between the field effect device 100 with a RFID transmitter 400, whose RFID chip 401 is connected between the source 120 and the drain 130 of the field effect device 100, where the RFID transmitter 400 is remotely connected to a RFID receiver RFID-R, through the antenna 402.

Upon a sensing event, the potential $V_{GS}$ between the gate terminal 140 and the source terminal 120 is subject to a variation. Then the semiconductor channel layer 110 impedance Z varies according to a characteristic curve like the one plotted in FIG. 9.

Figure 9:
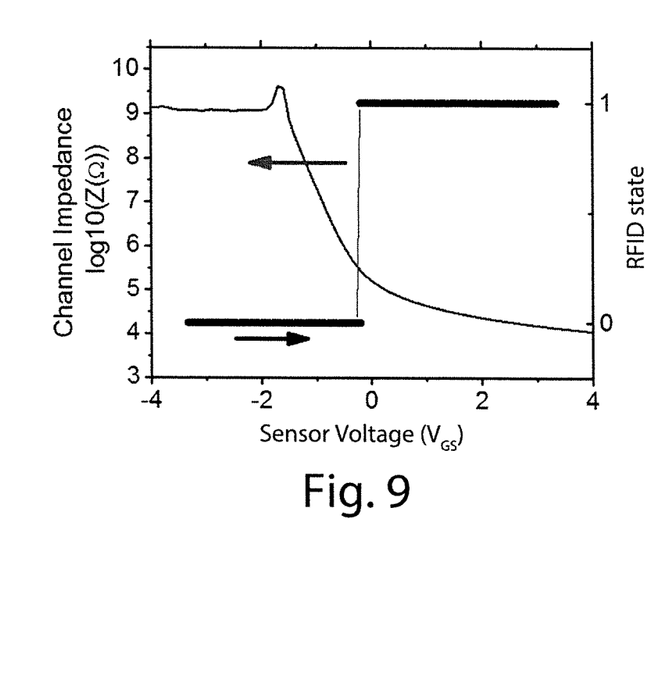
FIG. 9 shows a characteristic curve of the drain-source impedance Z as a function of the gate-source voltage, together with the RFID logic state function.

The RFID transmitter state is then switched from high-impedance (0 logic state) to low-impedance (1 logic state), as shown in said FIG. 9.

As it can be seen, upon the sensing event the semiconductor channel layer 110, the impedance Z decreases considerably, allowing the change of the logic state, if measured in voltage, between the source 120 and the drain 130 electrodes of the field effect device 100.

Figure 10A:
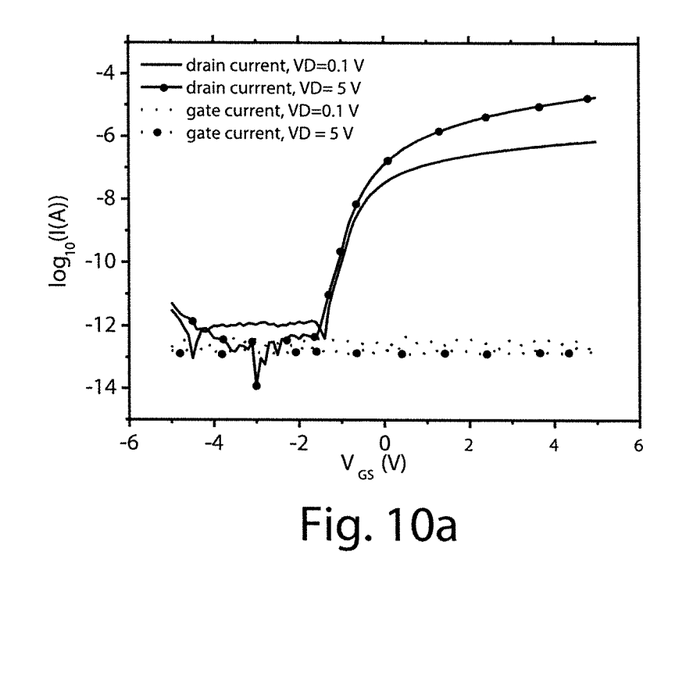
FIGS. 10a and 10b show the transfer characteristics of the field effect device according to the invention and its frequency response.
Figure 10B:
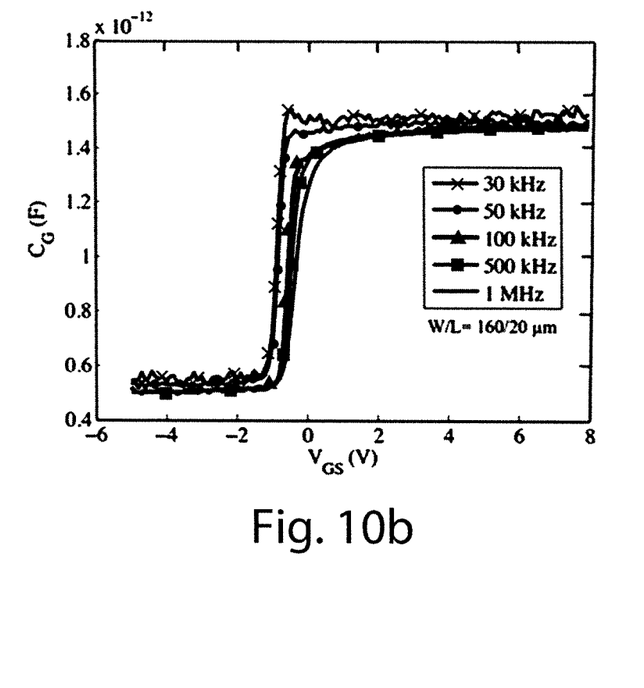

FIGS. 10a and 10b show the transfer characteristics of a field effect device 100 and its frequency response. In particular, in said FIGS. 10a and 10b there are respectively plotted the drain currents and the gate currents as a function of gate-source voltage, at different drain voltages, and the gate capacity (in picoFarad) $C_G$ as a function of the gate-source voltage $V_{GS}$, at different frequencies.

Upon a sensing event, the voltage at the gate electrode 140 remains constant, thus leaving unaltered the impedance Z probed by the RFID chip 401. In this way, the occurrence of the sensing event is stored in a passive memory state, as better explained below, where some applications of the field effect device 100 are examined, particularly directed toward the application of the RFID devices, for which, as it is well known, high sensitive devices are required to improve the detection sensitivity.

Indeed, in many applications it is necessary to guarantee that environmental conditions for example in a working place, in a storage room, in a technical engine (motor, computer) or in a parcel remain within a certain tolerance interval to avoid a possible health risk or damage.

For the applications described below the following parameters are relevant:
- sufficiently high on/off ratio that matches the impedance requirements of typical RFID chip 401;
- steep sub-threshold slope, which determines the width of the transition region, in which the sensor state is not well defined;
- low parasitic capacitance to realize a high impedance state also at high operation frequencies;
- a low leakage current (<10 $nA/cm^2$), to realize stable charge storage; and
- a high cut-off frequency (>30 kHz) to realize a low-impedance state at RFID chip 401 frequencies.

From the polarization standpoints, it is apparent that the device 100 is operated close to threshold, therefore even small voltage variations normally between the gate electrode 140 and the source electrode 120 lead to large variations in semiconductor channel 110 impedance that are directly detected by the RFID sensor 400 terminals.

Figure 11:
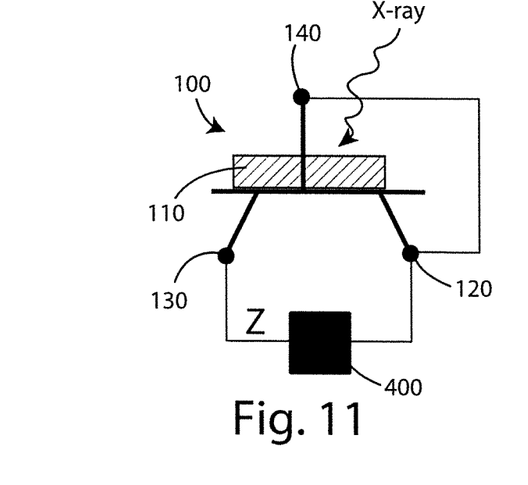
FIG. 11 shows a circuit diagram of the field effect device according to the present invention adapted to detect ionizing radiations, connected to a RFID transmitter.
Figure 12:
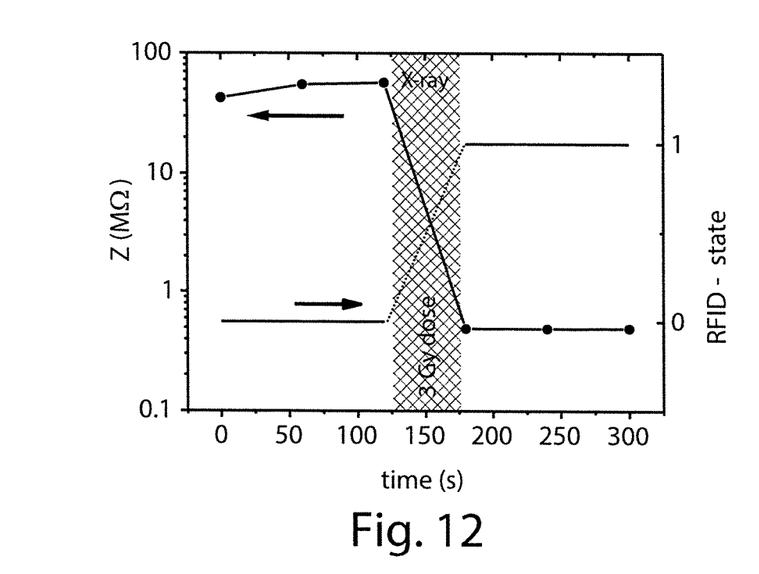
FIG. 12 shows a characteristic curve of the drain-source impedance Z as a function of the gate-source voltage, together with the RFID logic state function referred to FIG. 11.

FIG. 11 shows the field effect device 100, according to the first embodiment, where a RFID transmitter 400 is connected between the source electrode 120 and the drain electrode 130, then parallel with the semiconductor channel layer 110. The source electrode 120 is also connected with the gate electrode 140. An ionization radiation beam, X-rays in the figure, beams on the semiconductor channel layer 110, causing the logic state switch, as shown in FIG. 12, due to the impedance increase of the semiconductor channel layer 110.

This logic switch configuration is read by RFID transmitter 400, which transmits an RFID receiver RFID-R, by the related antenna 402.

Figure 13:
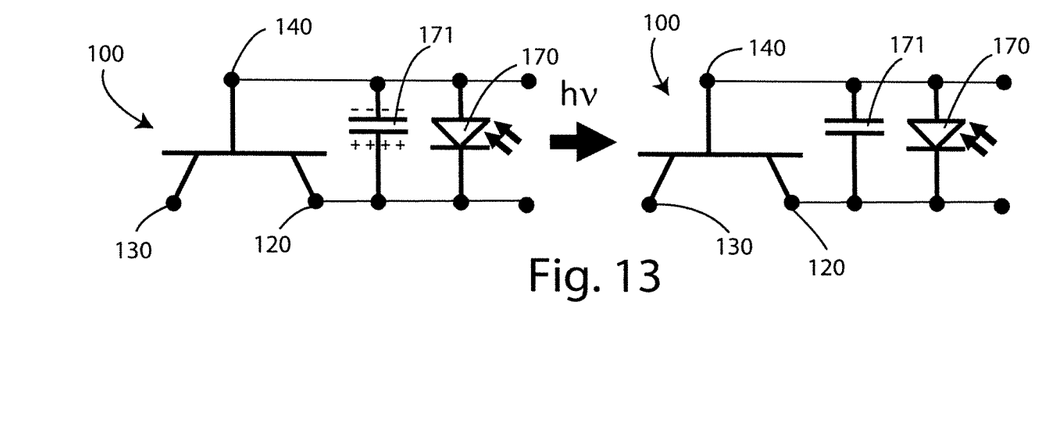
FIG. 13 shows a circuit diagram of the field affect device according to the invention adapted to detect light radiation.
Figure 14:
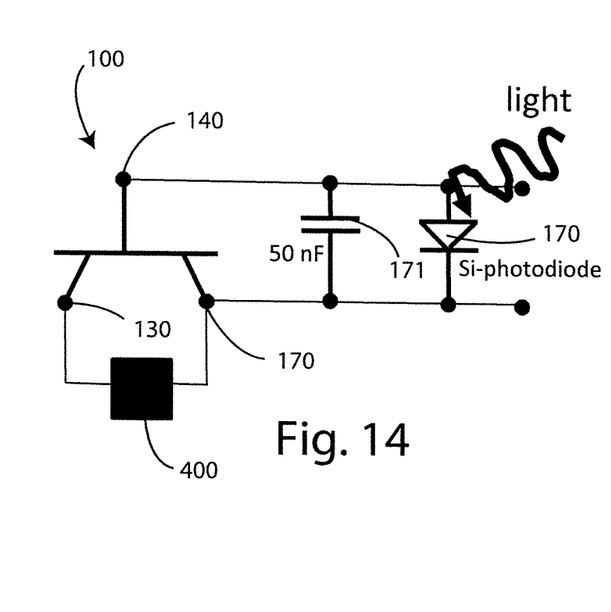
FIG. 14 shows the circuit diagram of FIG. 13 where the field affect device according to the invention is connected to a RFID transmitter.
Figure 15:
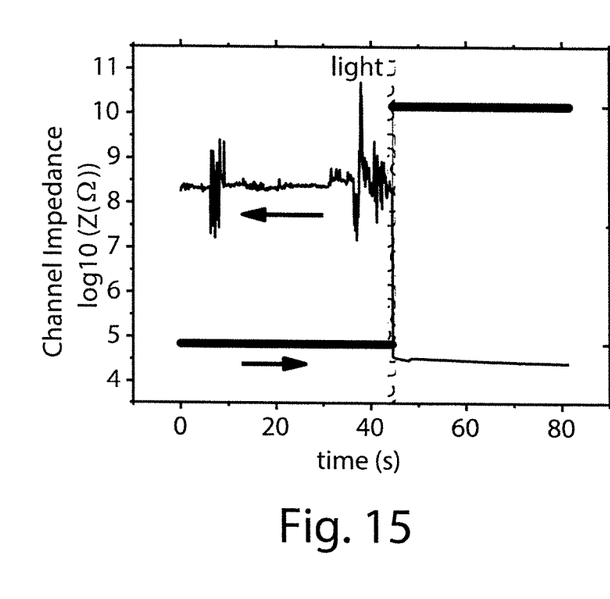
FIG. 15 shows a characteristic curve of the drain-source impedance Z of the field affect device according to the invention is a function of time, together with the RFID logic state.

Referring to FIG. 13-15, a second embodiment of the field effect device 100 is shown, where the sensing means comprises a photodiode 170 and a capacitor 171, both parallel connected to said gate electrode 140 and said source electrode 120.

When a light beam, having a wavelength within the visible band or in the nearby of the same (e.g. UV or IR bands), reaches said photodiode 170, the latter conduces, so that the potential between the gate electrode 140 and the source electrode 120 varies. FIG. 15 shows the variation of the impedance of the semiconductor channel layer 110 and the consequent RFID chip 401 logic state switch as a function of time.

Figure 16A:
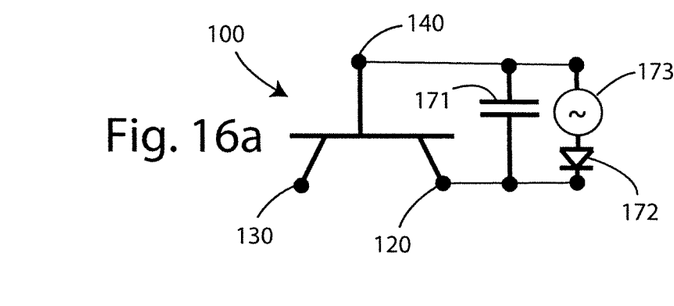
FIGS. 16a and 16b show the operation of a circuit diagram of the field affect device according to the invention adapted to detect mechanical stresses.
Figure 16B:
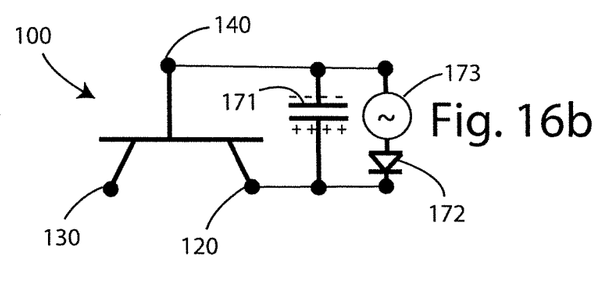

FIGS. 16a and 16b show a third embodiment of the invention, wherein the sensing means of said field effect device 100 according to the invention comprises a capacity 171, connected between said gate electrode 140 and said source electrode 120, and a rectifier diode 172, series connected with a piezoelectric sensor 173, connected to said gate electrode 140 and to said source electrode 120.

In case of a mechanical stress is applied to the piezoelectric sensor 173, the gate-source potential changes, causing a variation of the impedance of the semiconductor channel layer 110, thus allowing the logic switching off the field effect device 100.

Figure 17A:
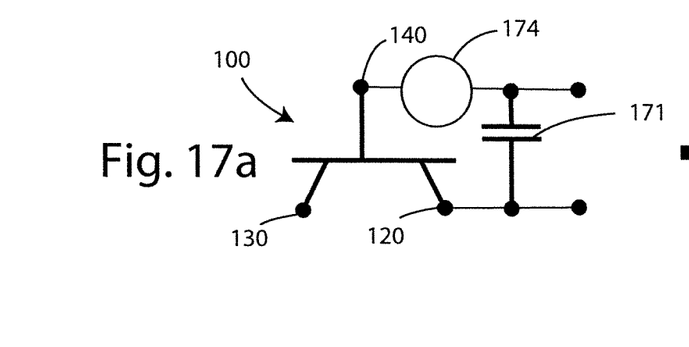
FIGS. 17a and 17b show a circuit diagram of the field affect device according to the invention adapted to detect temperature variations.
Figure 17B:
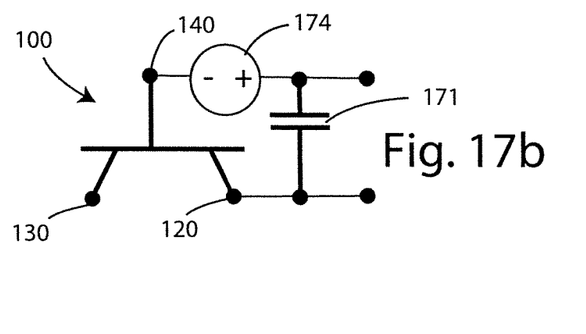

Referring now to FIGS. 17a and 17b, a fourth embodiment of the invention is shown, in which sensing means comprises a capacitor 171 and a pyroelectric sensor 174, capable of sensing the environment temperature. The capacitor 171 and said pyroelectric sensor 174 are series connected.

Said sensing means are connected between the gate electrode 140 and the source electrode 120, as the other embodiments above described.

The operation of this embodiment is the analogous of the others. Variation of the gate-source potential $V_{GS}$ causes the variation of the impedance Z of the semiconductor channel layer 110.

Figure 18A:
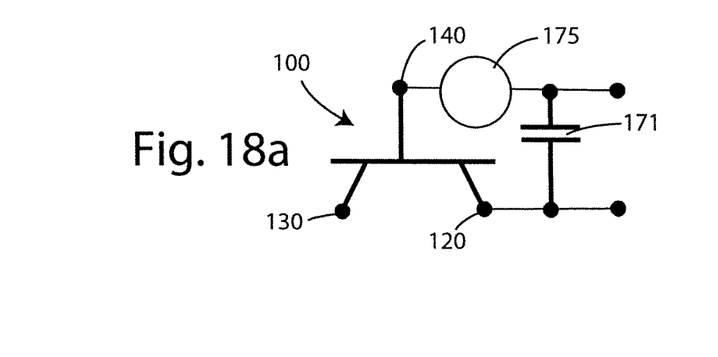
FIGS. 18a and 18b show a circuit diagram of the field affect device according to the invention adapted to detect chemical substances.
Figure 18B:
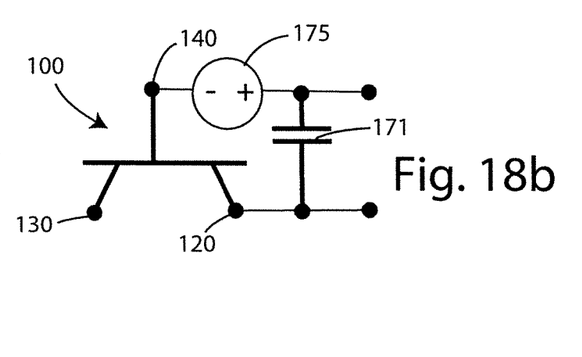

Referring to FIGS. 18a and 18b, a fourth embodiment of the invention is shown, wherein the sensor means now comprises a capacitor 171 and a chemical sensor 175. The connection of said chemical sensor 175 and said capacitor 171 is the same the third embodiment described above.

Also the electrical operation is the same of the third embodiment shown in FIGS. 17a and 17b, with the apparent difference that in that case it is a chemical substance detection, as sensing event, that changes the electrical state of the sensor and then the gate-source voltage, so as to change the impedance between said source electrode 120 and said drain electrode 130.

As it can be seen, in all the embodiments described above, a RFID chip 401 can be connected between said source electrode 120 and said drain electrode 130, so as to detect the variation of the potential between said electrodes, in transmitting the states change, namely the detection of ionization radiation, light, mechanical stress, variation of temperature and detection of chemical substances to a RFID receiver RFID-R.

It is seen that even the above mentioned passive components, as the capacitor 171, as well as the different sensors, can be integrated in a single device.

In addition, the several above mentioned sensing means can be combined each other.

An advantage of the field effect device according to the invention is that of enabling to create low-cost RFID sensors capable of monitoring if certain environmental conditions (ionizing radiation, light, temperature, chemicals, mechanical forces) go beyond a defined threshold. Once conditions are beyond threshold, the RFID sensor state is changed and the event can be traced at a later time using a wireless RFID readout systems.

A further advantage of the device according to the invention is that of introducing innovative nanostructured materials allowed to combine unique electronic sensor performance, with the possibility to deposit sensors in microstructured arrays on large-areas and on flexible plastic substrates.

The present invention has been described for illustrative but not limitative purposes, according to its preferred embodiments, but it is to be understood that modifications and/or changes can be introduced by those skilled in the art without departing from the relevant scope as defined in the enclosed claims.

The invention claimed is:

1. A sensitive field effect device comprising;
   a substrate; and
   a plurality of ionization sensitive field effect devices, arranged on said substrate, wherein each of said ionization sensitive field effect devices comprises:
   a semiconductor channel comprising a layer made of an amorphous oxide,
   a source electrode connected to said semiconductor channel,
   a drain electrode connected to said semiconductor channel, such that said semiconductor channel is interposed between said source electrode and said drain electrode,
   a gate electrode, wherein a gate capacity ($C_G$) of the gate electrode is a function of a gate-source voltage ($V_{GS}$) at different frequencies,
   a dielectric layer interposed between said gate electrode and said semiconductor channel, the dielectric layer arranged to be exposed to an ionizing radiation, the dielectric layer comprising at least one main layer made of at least one material including at least one cation element with an atomic number selected so as to increase an absorption of said incident ionizing radiation to be sensed, wherein said at least one material of said dielectric layer has a high atomic number Z, said atomic number Z being higher than 36 (Z>36),
   at least one RFID transmitter including an RFID chip connected to the source electrode and the drain electrode of a related field effect device, wherein the RFID transmitter is configured to be remotely connectable to a RFID receiver (RFID-R);
   wherein said RFID transmitter is configured to change state from a first logic state of high-impedance to a second logic state of low-impedance and is further configured to transmit the state change to said RFID receiver (RFID-R), and
   wherein the gate electrode is connected to a first terminal of a photodiode and the source electrode is connected to a second terminal of the photodiode and, responsive to receiving light, the photodiode conducts and causes a potential between the gate electrode and the source electrode to vary the RFID transmitter to transmit the state change.

2. The device according to claim 1, wherein said amorphous oxide is a high mobility amorphous oxide type and is selected from a group consisting of: Indium Gallium Zinc Oxide (IGZO) and/or Indium Hafnium Zinc Oxide (IHZO) and/or Zinc Tin Oxide (ZTO) and/or Gallium Zinc Tin Oxide (GZTO).

3. The device according to claim 1, wherein said at least one main layer of said dielectric layer is made of Yttrium Oxide ($Y_2O_3$) and/or Zirconium Oxide ($ZrO_2$) and/or Hafnium Oxide ($HfO_2$) and/or Tantalum Pentoxide ($Ta_2O_5$) and/or Bismuth Oxide ($Bi_2O_3$).

4. The device according to claim 1, wherein said dielectric layer is in electrical contact with said source electrode and said drain electrode.

5. The device according to claim 1, wherein said dielectric layer includes a thickness greater than or equal 150 nm.

6. The device according to claim 1, wherein said dielectric layer is a multilayer, comprising one or more insulating layers with an atomic number lower than the atomic number of said main layer.

7. The device according to claim 6, wherein said one or more insulating layers of said dielectric layer are made of silicon-dioxide ($SiO_2$) and/or aluminum-oxide ($Al_2O_3$).

8. The device according to claim 6, wherein said dielectric layer comprises
   the combination of said insulating layer, with lower atomic number atoms, and said main layer repeated from two to ten times, and
   a top layer of the said insulating layer with lower atomic number atoms.

9. The device according to claim 1, wherein the device comprises at least one substrate, on which said gate electrode and said dielectric layer are deposited.

10. The device according to claim 9, wherein said at least one substrate is flexible.

11. The device according to claim 9, wherein said at least one substrate is made of polyethylene naphthalate.

12. The device according to claim 1, wherein said gate, source and drain electrodes are made of conductive materials, including at least one of: molybdenum (Mo), copper (Cu), aluminum (Al), gold (Au) and/or silver (Ag), conducting oxides, Gallium-doped Zinc Oxide (GZO) or Indium Zinc Oxide (IZO) and/or conducting polymers.

13. The device according claim 1, wherein said field effect devices are arranged as an array or as a matrix.

14. The device according to claim 1, wherein said RFID transmitter comprises an RFID chip and an antenna.

15. The device according to claim 1, wherein the device further comprises a plurality of RFID transmitters, each one being operatively connected to a related field effect device.

16. The sensitive field effect device of claim 1, wherein the photodiode is connected in parallel to a capacitor, and wherein the gate electrode is connected to a first terminal of the capacitor and the source electrode is connected to a second terminal of the capacitor.

* * * * *